United States Patent
McCune et al.

(10) Patent No.: US 12,414,616 B2
(45) Date of Patent: Sep. 16, 2025

(54) UTILITY BAG WITH WORKSTATION

(71) Applicant: Plano Molding Company, LLC, Plano, IL (US)

(72) Inventors: Clark McCune, Roanoke, TX (US); Josephine Benkers, Grand Prairie, TX (US)

(73) Assignee: Plano Molding Company, LLC, Plano, IL (US)

( * ) Notice: Subject to any disclaimer, the term of this patent is extended or adjusted under 35 U.S.C. 154(b) by 618 days.

(21) Appl. No.: 16/801,409

(22) Filed: Feb. 26, 2020

(65) Prior Publication Data

US 2020/0275752 A1 Sep. 3, 2020

Related U.S. Application Data

(60) Provisional application No. 62/811,897, filed on Feb. 28, 2019.

(51) Int. Cl.
| | |
|---|---|
| *B65D 85/00* | (2006.01) |
| *A45C 7/00* | (2006.01) |
| *A45C 13/10* | (2006.01) |
| *H02S 20/30* | (2014.01) |

(52) U.S. Cl.
CPC ............ *A45C 13/10* (2013.01); *A45C 7/0077* (2013.01); *H02S 20/30* (2014.12)

(58) Field of Classification Search
CPC .... B65D 65/38; B65D 2313/04; A45C 13/10; A45C 13/1069; A45C 7/0077; H02S 20/30
USPC ... 206/234, 349, 372, 373, 315.11, 460, 818
See application file for complete search history.

(56) References Cited

U.S. PATENT DOCUMENTS

| | | | | |
|---|---|---|---|---|
| 3,868,016 A | * | 2/1975 | Szpur | A61B 50/33 211/DIG. 1 |
| 4,826,059 A | * | 5/1989 | Bosch | A45C 11/24 211/DIG. 1 |
| 4,928,823 A | * | 5/1990 | Campbell | A45C 13/02 224/679 |
| 5,274,937 A | * | 1/1994 | Birnbaum | G09F 7/04 40/661 |
| 5,367,278 A | * | 11/1994 | Yoshikawa | H01F 7/0268 224/183 |
| 5,396,999 A | * | 3/1995 | Sandheinrich | A45C 13/08 206/541 |
| 6,808,067 B2 | * | 10/2004 | Benatz | B25G 1/085 206/378 |
| 6,831,541 B1 | * | 12/2004 | Seidler | H01F 7/0263 206/818 |
| 7,946,418 B1 | * | 5/2011 | Cerynik | B25H 3/021 206/362 |

(Continued)

*Primary Examiner* — Luan K Bui
(74) *Attorney, Agent, or Firm* — Husch Blackwell LLP

(57) ABSTRACT

A utility bag system having a body that includes a first shell. The utility bag system can include a utility extension having a second shell. The utility bag system can include a fastener arranged to removably attach the utility extension to the body. The body can include at least one of a body portion, a lid portion, and a storage unit. The utility extension can include a pair of opposite planar surfaces. At least one of the body and the utility extension can have a magnetozone arranged to form a workstation. The workstation can be arranged to secure a metallic or magnetized article to the first or second shell. The first and second shell can be made of the same or a different material.

14 Claims, 6 Drawing Sheets

(56) References Cited

U.S. PATENT DOCUMENTS

| | | | |
|---|---|---|---|
| 8,157,098 B2* | 4/2012 | Hertz | A47G 19/025 |
| | | | 381/334 |
| 9,901,150 B2* | 2/2018 | Fenton | A45C 3/08 |
| 2004/0016673 A1* | 1/2004 | Kovich | A45C 11/20 |
| | | | 206/542 |
| 2014/0076764 A1* | 3/2014 | Wang | B65D 85/48 |
| | | | 206/454 |
| 2017/0267420 A1* | 9/2017 | Sudo | B65D 25/005 |
| 2018/0079588 A1* | 3/2018 | Whittington | G07C 9/00896 |

* cited by examiner

UTILITY BAG WITH WORKSTATION

CROSS-REFERENCE TO PRIOR APPLICATION

This application claims priority to and the benefit thereof from U.S. Provisional Patent Application No. 62/811,897, filed Feb. 28, 2019, titled "Utility Bag With Workstation," the entirety of which is hereby incorporated herein by reference.

FIELD OF THE DISCLOSURE

The disclosure relates generally to a utility bag, and, more particularly to a utility bag having a drop zone assembly that serves as a utility workstation. The disclosure also relates to a utility bag having a solar power source and electrical charging station.

BACKGROUND OF THE DISCLOSURE

During fishing, or other outdoor activities, it is often necessary to use items for rigging, switching bait or holding tools. The items can be placed on a surface to dry (e.g., terminal tackle) or while the items (e.g., baits) are not in use. The top of a tackle bag is often used as a place to store these items because of the close proximity to the user for quick access and its flat surface. Current tackle bags will often use a foam patch to place hooks for this reason. The foam allows the user to capture the tackle and prevent it from falling away from the bag. However, this foam breaks down over time because of use and outdoor elements and needs replacement.

The inventors have discovered an unfulfilled need exists for a utility workstation that is easy to use and can hold items to dry, or when items are not in use, and that can survive outdoor elements such as sun, heat, cold, rain, or wind.

SUMMARY OF THE DISCLOSURE

According to the principles of the disclosure, a utility bag, a utility extension and utility bag system are disclosed, any one or more of which can include a utility workstation. The utility workstation includes one or more magnetozones that are positioned to hold articles within easy access of a user and that can hold wet articles to dry. The magnetozones can be located anywhere on the utility extension or at any one or more of the side walls, the top, or the bottom of the utility bag, or within an inner layer or shell of the utility bag. The magnetozone can prevent articles from falling off after the utility bag is jarred or opened. The articles can include, for example, tools, tackle, hooks, sinkers, floats, lures, spears, or any metallic or magnetized object.

In a nonlimiting embodiment, the utility bag system comprises a body having at least one of a body portion, a lid portion, and a storage unit; a utility extension having a pair of opposite planar surfaces; and a fastener arranged to removably attach one of the planar surfaces to the body, wherein the body has a first shell, wherein the utility extension has a second shell, wherein at least one of the body and the utility extension comprises a magnetozone arranged to secure a metallic or magnetized article. The utility bag system can comprise a solar panel. The utility bag system can comprise a charging station, wherein the charging station can be charged by the solar panel. The body can comprise an inner shell having a magnetozone. The storage unit can comprise a magnetozone.

In another nonlimiting embodiment, the utility bag system can comprise a body having a first shell, the body including a body portion; and a utility extension having a second shell, wherein the utility extension is arranged to removably attach to the body, and wherein the utility extension comprises a magnetozone that is arranged to secure a metallic or magnetized article to the second shell. The body can include a lid portion having a magnetozone on a surface of the first shell. The magnetozone can be located on an inner shell in the utility bag. The utility extension can comprise a fastener arranged to attach to the body. The utility bag can comprise a storage unit having a magnetozone. The storage unit can be arranged as a workstation when in an open position. The utility extension can comprise another magnetozone that can be arranged to secure the utility extension to a metallic or magnetized structure while simultaneously securing the metallic or magnetized article to the second shell. The other magnetozone can be located on a surface of the second shell that is opposite said magnetozone. The magnetozone can be located on a surface of the second shell. The magnetozone can be formed by a magnet attached to the second shell. The magnetozone can be formed by a magnet located between an outer layer and an inner layer. The magnet can be attached to an outer layer in the second shell.

In another nonlimiting embodiment, the utility bag system comprises a body portion having a plurality of walls; a lid portion attached to the body portion; and a workstation having a magnetozone, wherein the workstation is formed on a surface of the lid portion, and wherein the lid portion or at least one of the plurality of walls is flexible. The utility bag system can comprise a utility extension having a pair of opposite planar surfaces. The body portion can be formed as a soft-body with the plurality of walls made of a flexible material. The body portion can have a rigid bottom and the body portion can be collapsible.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION OF THE DISCLOSURE

Figure 1:
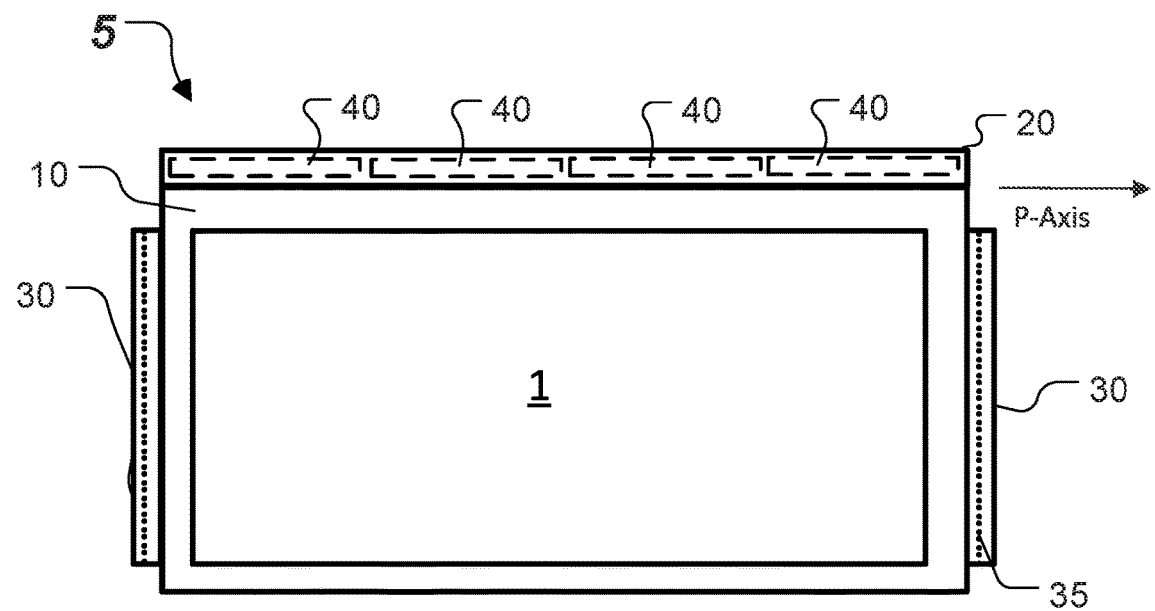
FIG. 1 depicts an example of a utility bag that is constructed according to the principles of the disclosure.

The embodiments of the disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

Figure 2:
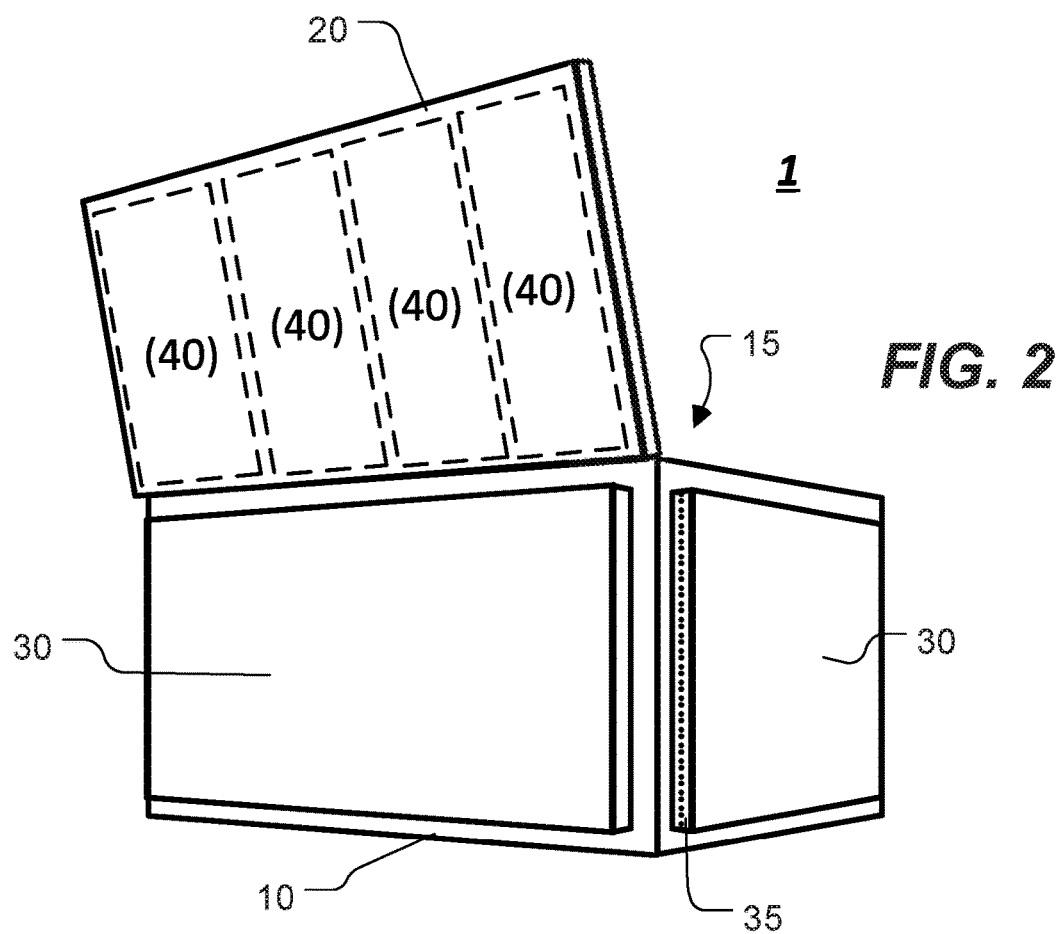
FIG. 2 depicts another view of the utility bag in FIG. 1, with a lid portion in an open position.

FIGS. 1 and 2 depict first and second views of an example of a utility bag 1 constructed according to the principles of the disclosure. In FIG. 2, the utility bag 1 is seen with a lid portion 20 in an open position. The utility bag 1 can include, for example, a tackle bag, a range bag, a tool bag, a soft-good bag, or a storage container. The utility bag 1 includes a body 5. The body 5 can include an outer shell comprising a material, such as, for example, cloth, fabric, cotton, canvas, burlap, jute, hemp, nylon, polyester, PE board, plastic, carbon fiber, carbon fiber reinforced polymer, fiberglass or metal. The body 5 can include an inner layer, such as, for example, a liner.

The body 5 includes a body portion 10 and the lid portion 20. The body portion 10 and/or lid portion 20 can be made of flexible material. The body portion 10 can include a rigid or hard bottom and walls made of a flexible material. The body 5 can be made to be collapsible. The lid portion 20 can function as a workstation when provided with one or more magnetozones that can secure metallic or magnetized articles to the lid portion 20. The body portion 10 can include a floor (not shown) and a plurality of walls (for example, four walls). One or more of the plurality of walls can be arranged to be collapsible. The body 5 can be formed as one piece or multiple pieces. For instance, the body 5 can be made as a single piece with the lid portion 20 integrally formed with the body portion 10 as one piece. Alternatively, the lid portion 20 and body portion 10 can be made as two or more pieces that are arranged to be attachable to form the body 5. The lid portion 20 can be connected to the body portion 10 along an edge, in which case the lid portion 20 can be arranged to pivot about the longitudinal axis (P-Axis) of the edge. The body portion 10 and lid portion 20 can include a living hinge between them. The living hinge can have a longitudinal axis that is parallel with the P-Axis.

The utility bag 1 can include one or more storage units 30. The storage unit 30 can be made with the body 5 as one piece. Alternatively, the storage unit 30 and body 5 can be made as two or more pieces that are arranged to be attachable to form the utility bag 1. The storage unit 30 can include a closure mechanism 35, such as, for example, a zipper, a hook-and-loop fastener, a button, a pin, a snap, a hook-and-eye, or any device arranged to attach two or more structures to form an enclosure that can hold an article.

The utility bag 1 can comprise one or more magnetozones. The magnetozone can be formed by one or more magnets 40 included in, attached to or formed integrally with the body 5. The magnet 40 can be included in, attached to or formed integrally with the floor (not shown) one or more walls, or the top of the body 5. The magnet 40 can be attached to, included in or formed integrally as part of the outer shell or an inner layer of the body 5. The magnet 40 can be included between two or more layers in the body 5, such as, for example, in the outer shell or an inner layer of the body 5.

The magnet 40 can include, for example, a permanent magnet, a ferromagnet, a ferromagnetic fluid, an electromagnet, or any device or material capable of forming the magnetozone by creating a magnetic field. The magnet 40 can include, for example, a magnetic north (N) pole and magnetic south (S) pole, or a plurality of alternating magnetic poles (for example, N, S, N, S, . . . ). The magnet 40 can have any shape, including, for example, circle, disc, cylinder, square, block, plate, or rod. The magnet 40 can include a ferromagnetic material, such as, for example, iron, or a ferromagnetic fluid or compound that can be infused in or mixed with the material to make the outer shell of the body 5.

The magnetozone(s) can be positioned anywhere on the body 5 or utility extension 6, discussed below, to form a workstation to hold articles within easy access of a user, or to hold wet articles to dry. The magnetozone(s) and, therefore, the workstation can be located anywhere on the utility extension 6 or at any one or more areas of the body 5, such as for example, a side wall, a top, a bottom or inside the utility bag. The workstation can prevent articles from falling off after the utility bag is jarred or opened. A magnetozone in the bottom of the utility bag can serve to secure the utility bag to a metallic surface, such as, for example, a vehicle. The articles can include, for example, tools, tackle, hooks, sinkers, floats, lures, spears, or any metallic or magnetized object.

Figure 3A:
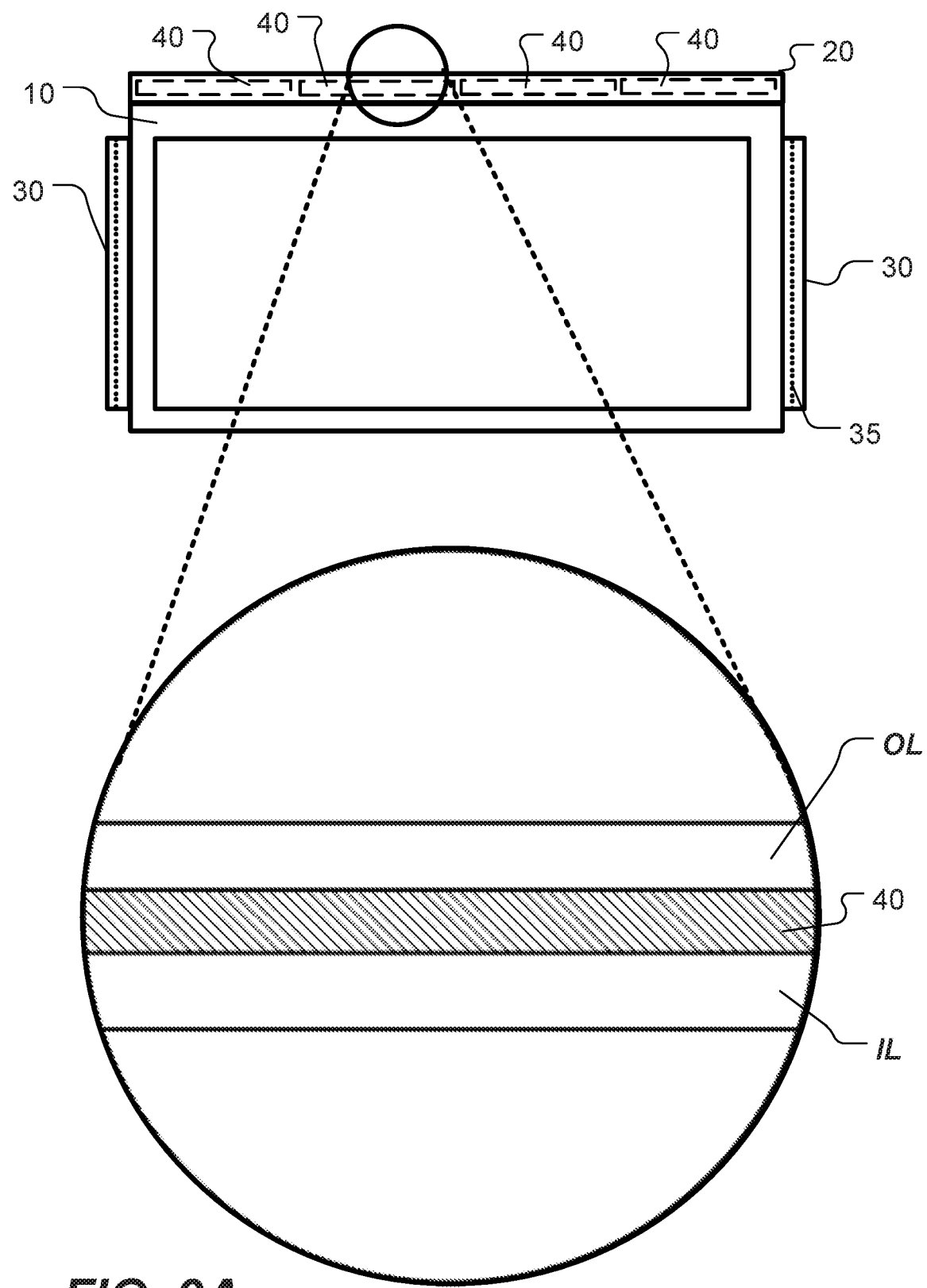
FIGS. 3A to 3C depict nonlimiting examples of a cross-section area of a shell of the utility bag shown in FIG. 1.
Figure 3B:
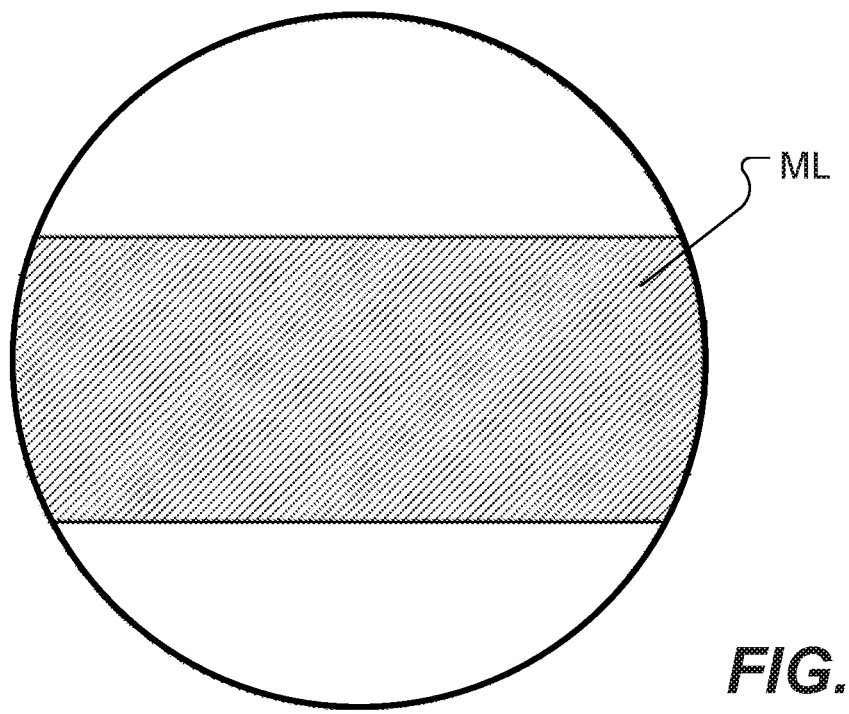
Figure 3C:
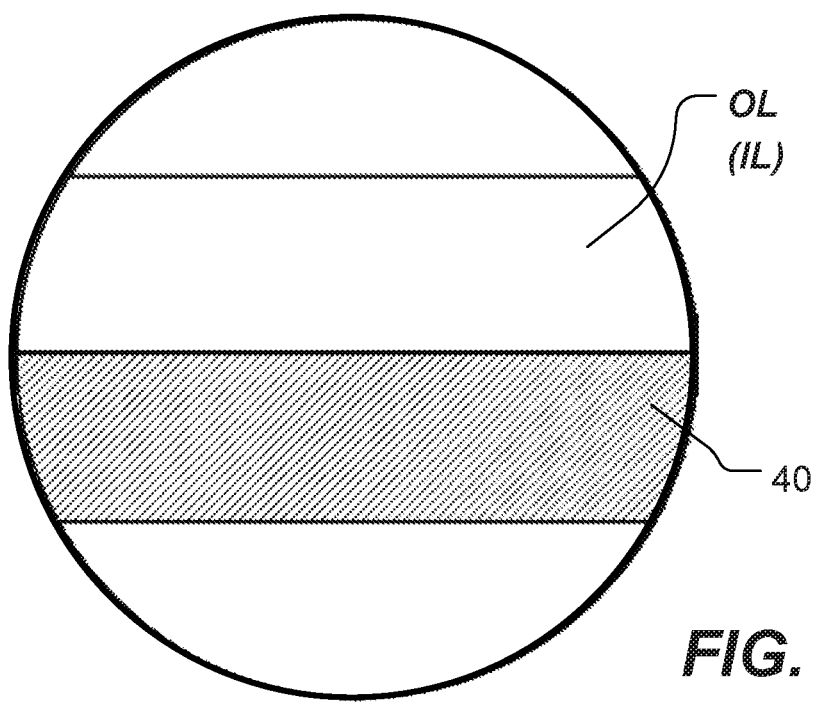

FIGS. 3A to 3C depict three nonlimiting examples of a cross-sectional area in the outer shell of the body 5. As seen in the Figures, the outer shell can include one or more layers of material, including, for example, an outer layer OL that can form the outer surface of the shell. The shell can include an inner layer IL. The inner layer IL can form the inner surface in the body 5.

In the nonlimiting example depicted in FIG. 3A, the shell of the body 5 includes two layers that form the outer shell, including the outer layer (OL) and inner layer (IL). The shell can include one or more additional layers. The magnet 40 can be included between the outer OL and inner IL layers to form the magnetozone. The outer and inner layers can be fused together with the magnet 40 between the layers. Alternatively, the outer OL and inner IL layers can be attached to each other by an attachment mechanism, such as, for example, an adhesive, stitching, hook-and-loop fastener, zipper, or snaps. The magnet 40 can be included in the body 5 to form a magnetozone in one or more subareas or the entire area of the outer or inner shell of the body 5. The magnet 40 can be included as a single magnet 40 or a plurality of magnets 40, such as, for example, an array of magnets 40. For example, as seen in FIGS. 1 and 2, four magnets 40 can be provided in the outer shell of the lid portion 20 to form four respective magnetozones on the outer shell of the lid portion 20. The magnet 40 can be located in any part of the shell of the body 5, including for example, the lid portion 20, body portion 10 or storage unit 30.

FIG. 3B depicts a nonlimiting example in which the cross-sectional area of the outer shell of the body 5 includes a magneto layer ML. Although the shell is shown as including only the magneto layer ML in this example, the shell can include one or more additional layers. The magneto layer ML can be arranged to form a magnetozone in one or more subareas of the outer shell of the body 5, such as, for example, substantially the entire area of the top surface of the lid portion 20, as seen, for example, in FIG. 2. The magneto layer ML can include a material that can be infused or mixed with, for example, a ferromagnetic fluid or compound to create a magnetized layer. The magneto layer ML can be attached to, blended with or integrally formed with one or more layers of a non-ferromagnetic material to form the outer shell of the body 5. The one or more layers of non-ferromagnetic material can be stacked with the magneto layer ML (for example, shown in FIG. 3), blended, attached or integrally formed with the magneto layer ML as a single layer having regions made of the magneto layer ML. The magneto layer ML can include a high-coercivity ferromagnetic compound, such as, for example, ferric oxide, mixed with a synthetic binder, such as, for example, a plastic binder, to form a durable layer. In a nonlimiting embodiment, the magneto layer ML can form the sheet of the lid portion 20.

FIG. 3C depicts a nonlimiting example in which the cross-sectional area of the shell of the body 5 includes the magnet 40 and an outer layer OL or inner layer IL. The magnet 40 can be attached to the outer OL or inner IL layer, for example, using an adhesive.

Figure 4:
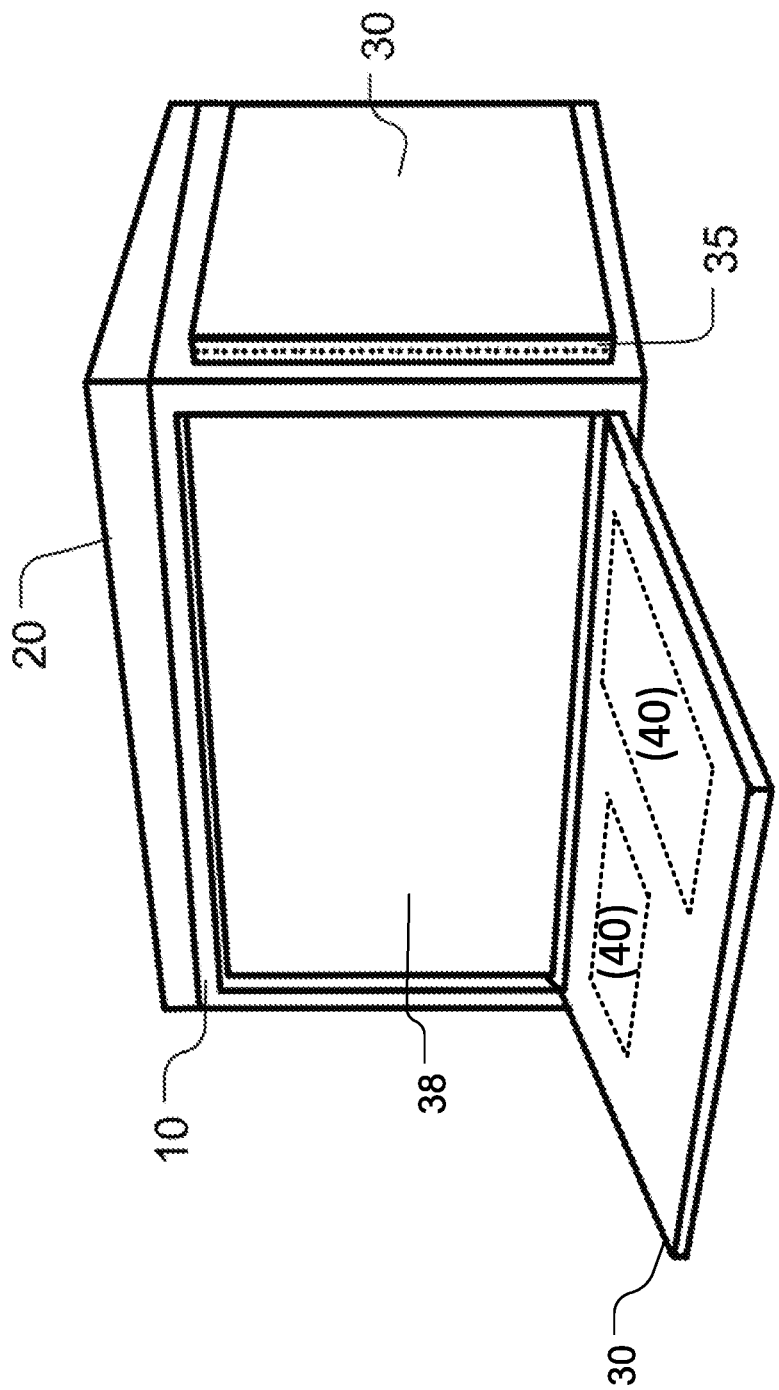
FIG. 4 depicts a view of another example of a utility bag, including a storage unit in an open position.

FIG. 4 depicts a view of an example of the utility bag 1 with a storage unit 30 in an open position, wherein the storage unit 30 includes two magnetozones formed by respective magnets 40 included in the shell. As seen, the storage unit 30 can include one or more magnets 40 in its outer shell, which can be opened to provide access to a compartment 38 formed by the storage unit 30 when it is in a closed position (for example, shown in FIG. 2). When in the open position (shown in FIG. 4), the storage unit 30 can function as a workstation.

Figure 5:
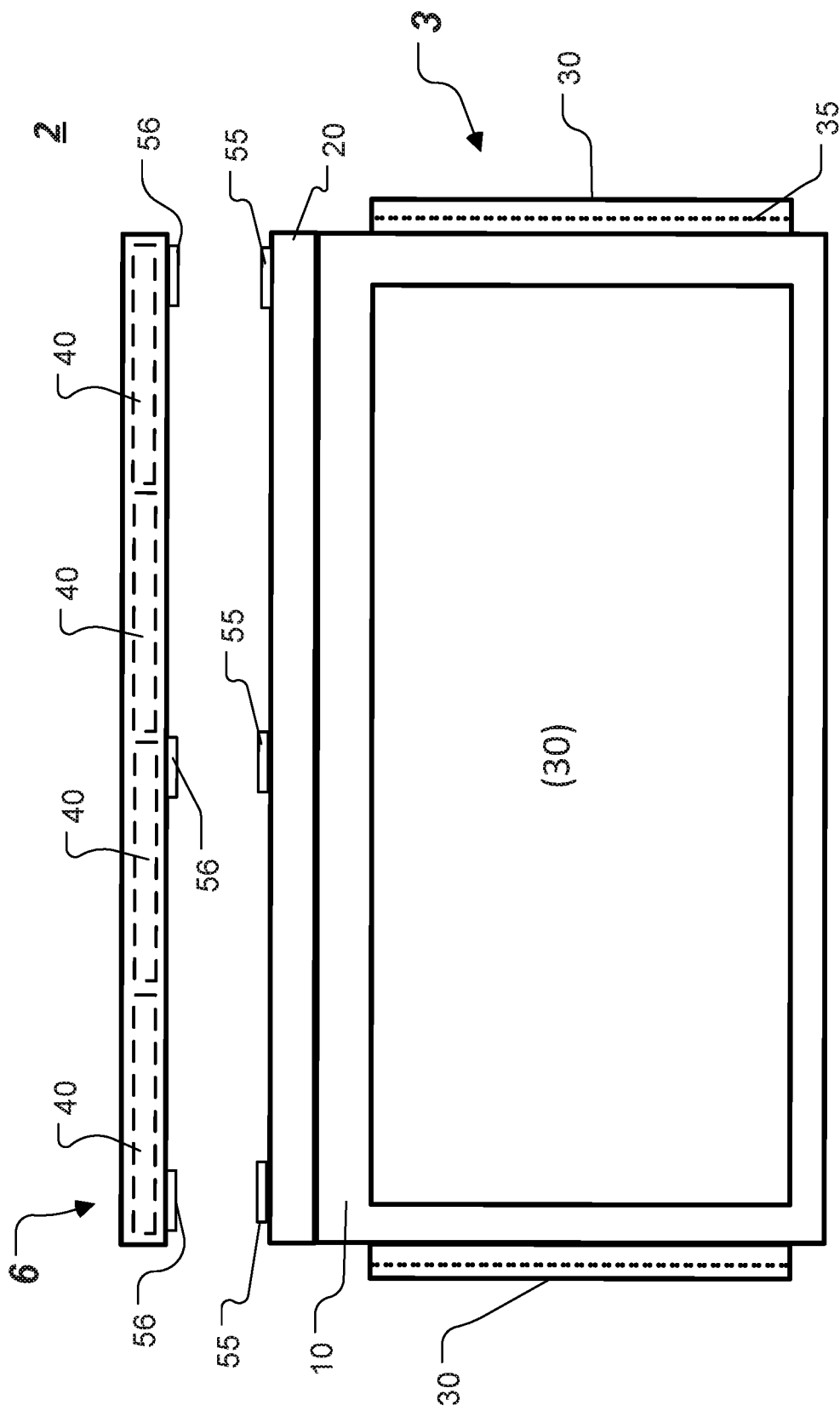
FIG. 5 depicts an example of a utility bag system that is constructed according to the principles of the disclosure.

FIG. 5 depicts a nonlimiting example of a utility bag system 2 that is constructed according to the principles of the disclosure. The utility bag system 2 includes a utility bag 3 and a utility extension 6. The utility extension 6 can be arranged to fold or flex. The utility extension 6 can be made of a different material or the same material as the body 5 of the utility bag 1 (for example, shown in FIG. 1, 2 or 4). The utility extension 6 can include one or more magnetozones, including one or more magnets 40. The utility bag 3 can include, for example, the utility bag 1 (for example, shown in FIG. 1, 2 or 4) or any other utility bag, storage, container or structure. The utility extension 6 can be arranged to be removable from the utility bag 3, in which case the utility bag 3 can include one or more fasteners 55 that are arranged to attach to the utility extension 6. The utility extension 6 can include one or more fasteners 56 that are arranged to attach to the utility bag 3. The fasteners 55 and 56 can be arranged to engage each other to attach the utility extension 6 with the utility bag 3. The fasteners 55 or 56 can include, for example, a hook-and-loop (for example, VELCRO), a snap, an adhesive, stitching, magnet or any other attachment mechanism that can secure the utility extension 6 to the utility bag 3.

The utility extension 6 can be arranged to keep articles, such as, for example, tackle, tools, or bait within easy access of the user. The utility extension 6 can be arranged to allow wet articles to dry while the utility extension 6 is attached to the utility bag 3 or a metallic or magnetized structure, or used by itself. The magnetozone can prevent articles from falling off such as, for example, when the utility bag system 1 is jarred or the utility bag 3 opened.

Figure 6:
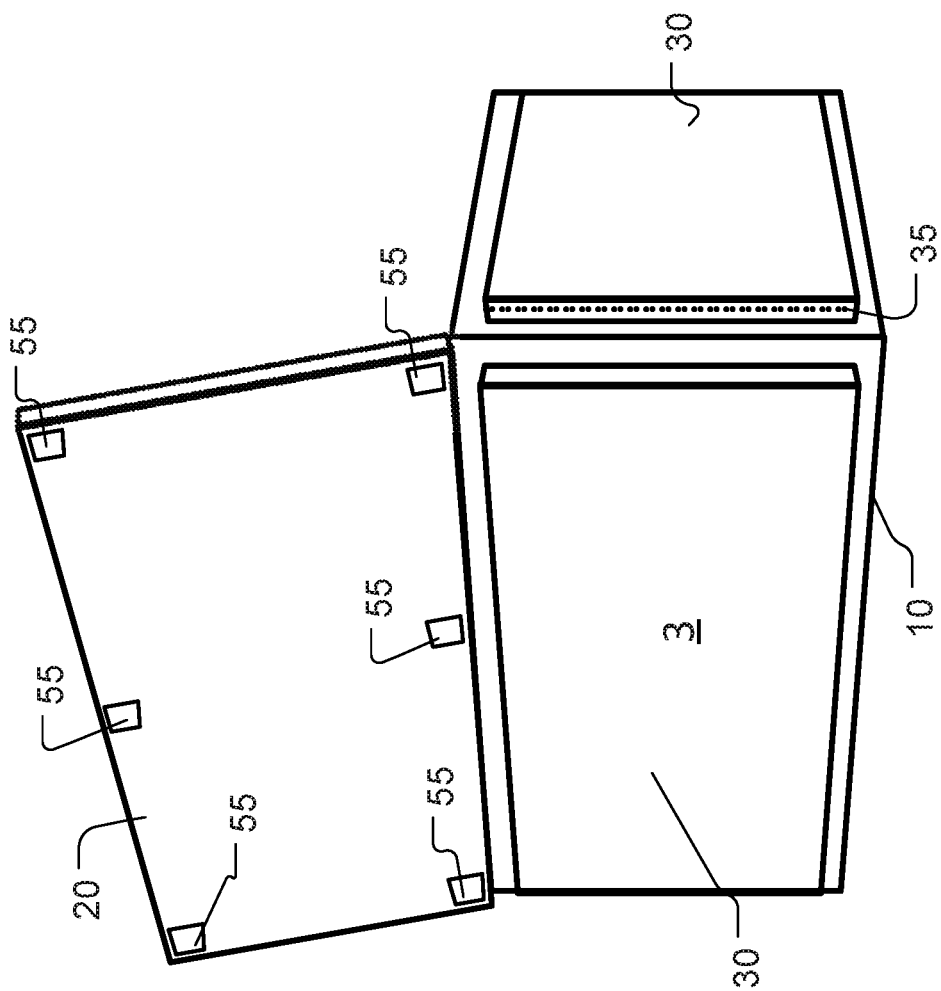
FIG. 6 depicts another view of the utility bag system in FIG. 5.
Figure 6:
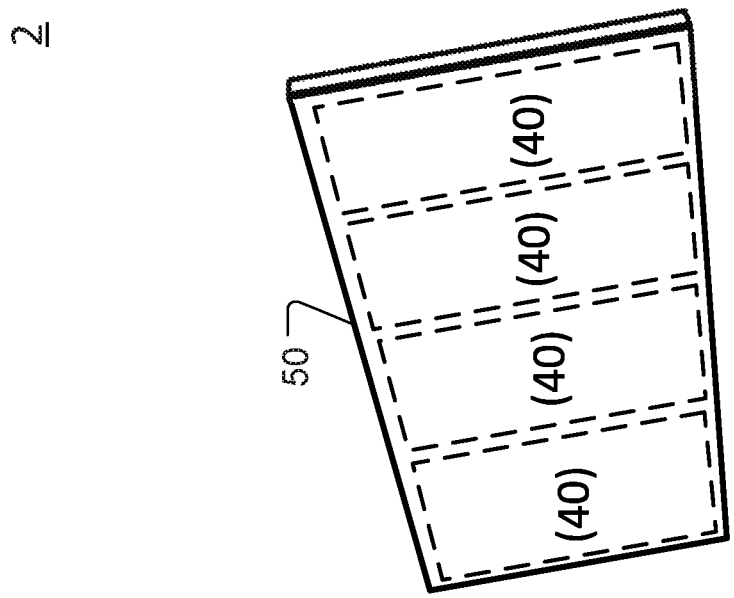

FIG. 6 depicts a view of the utility extension 6 removed from the utility bag 3 in the utility bag system 2. The utility extension 6 can be arranged to secure metallic or magnetized articles to one or more magnetozones on the utility extension 6, allowing for mobility or transport of the utility extension 6 with articles secured, separate from the utility bag 3. The magnetozone(s) can be located on opposite ends or surfaces of the utility extension 6, thereby allowing for one end or surface of the utility extension 6 to be removably affixed to a metallic or magnetized structure, such as, for example, a tool box, a vehicle body, or any metallic or magnetized object, while another end (for example, opposite end) securely holds the articles in place.

The utility extension 6 can include an outer shell that has a cross-section area as seen in, for example, FIGS. 3A to 3C and discussed above.

In a non-limiting example of the utility bag 1 (for example, shown in FIG. 1, 2 or 4) or utility bag system 2 (for example, shown in FIG. 5 or 6), the utility bag 1 (or 3) or the utility extension 6 can include a solar panel (not shown) and/or a power source (not shown), such as, for example a battery. The battery (not shown) can include a rechargeable battery. The power source can be charged by the solar panel. The solar panel can comprise rigid thin-film cells and modules or flexible thin-film cells and modules that can flex with the surface material of the outer shell of the utility bag 1 (or 3) or utility extension 6. The solar panel can be positioned on or integrated with the outer shell. The solar panel can be positioned, for example, on a top surface of the lid portion 20 (shown in FIG. 1 or 2) or on an inner shell of, for example, the storage unit 30, such that when the storage unit 30 is opened as seen in FIG. 4, the solar panel can be exposed to sunlight. The solar panel can be arranged on a portion of the utility bag 1 (or 3) or utility extension 6 for maximum exposure to sunlight during use.

The utility bag (for example, shown in FIG. 1, 2 or 4-6) or the utility extension 6 (for example, shown in FIG. 5 or 6) can include a charging station (not shown) for charging devices such as, for example, smartphones, fish-finder devices, digital cameras, smartwatches, or the like. The charging station (not shown) can include a wireless charging device (not shown), such as, for example, a charging pad (not shown), or one or more charging ports (not shown) for connecting charging cables to devices such as smartphones. The charging station can be affixed to the lid portion 20 of the utility bag 1 (shown in FIG. 1, 2 or 4) or the utility extension 6 (shown in FIG. 5 or 6), or any other portion of the utility bag that might be accessible for charging devices (not shown). The charging station can be positioned underneath the surface material, or integrated with the outer shell material, or affixed on top of the outer shell material.

The terms "a," "an," and "the," as used in this disclosure, means "one or more," unless expressly specified otherwise.

The terms "including," "comprising," and variations thereof, as used in this disclosure, mean "including, but not limited to," unless expressly specified otherwise.

Although process steps, method steps, or the like, may be described in a sequential order, such processes and methods can be configured to work in alternate orders. In other words, any sequence or order of steps that may be described does not necessarily indicate a requirement that the steps be performed in that order. The steps of the processes or methods described herein can be performed in any order practical. Further, some steps can be performed simultaneously.

When a single structure or article is described herein, it will be readily apparent that more than one device or article may be used in place of a single device or article. Similarly, where more than one device or article is described herein, it will be readily apparent that a single structure or article may be used in place of the more than one structure or article. The functionality or the features of a structure or article may be alternatively embodied by one or more other structures or articles that are not explicitly described as having such functionality or feature.

While the disclosure has been described in terms of exemplary embodiments, those skilled in the art will recognize that the disclosure can be practiced with modifications in the spirit and scope of the instant disclosure. These examples given above are merely illustrative and are not meant to be an exhaustive list of all possible designs, embodiments, applications or modifications of the disclosure.

What is claimed is:

1. A utility bag system, comprising:
a body portion including at least a bottom and a side wall;
a lid portion that is releasably attachable to the body portion;
a utility extension having a pair of opposite planar surfaces;
a solar panel positioned and located on one of the lid portion and the body portion; and
a charging station, wherein the charging station is charged by the solar panel;
wherein at least one of an exterior portion of the lid portion and the utility extension comprises a first magnetozone arranged to secure a metallic or magnetized article; and
wherein the utility extension is selectively attachable to at least one of the lid portion and the side wall of the body portion.

2. The utility bag system in claim 1, wherein the side wall comprises a second magnetozone.

3. The utility bag system in claim 1, wherein the lid portion comprises a second magnetozone.

4. The utility bag system in claim 1, wherein the lid portion is arranged as a workstation when in an open position.

5. A utility bag system, comprising:
a body portion including at least a bottom and one or more side walls;
a lid portion that is releasably attachable to the body portion;
a utility extension having a pair of opposite planar surfaces;
a solar panel positioned and located on one of the lid portion and the body portion;
wherein at least one of the lid portion and the utility extension comprises a magnetozone arranged to secure a metallic or magnetized article; and
wherein the utility extension is selectively attachable to at least one of the lid portion and the one or more side walls of the body portion.

6. A utility bag system, comprising:
a body portion; and
a lid portion attached to the body portion;
a utility extension having a first magnetozone that is arranged to secure a metallic or magnetized article to the utility extension; and
a solar panel positioned and located on one of the lid portion and the body portion;
wherein the utility extension is arranged to removably attach to each of the body portion and the lid portion such that when the utility extension is attached to one of the body portion and the lid portion, the first magnetozone is on an exterior surface of the utility extension.

7. The utility bag system in claim 6, wherein a second magnetozone is located on a surface of the lid portion.

8. The utility bag system in claim 6, wherein a second magnetozone is located on the body portion.

9. The utility bag system in claim 6, wherein the utility extension comprises a fastener arranged to attach to the body portion.

10. The utility bag system in claim 6, wherein the first magnetozone is located on an exterior of the utility extension.

11. The utility bag system in claim 10, wherein the first magnetozone is formed by a magnet located between an outer layer and an inner layer of the utility extension.

12. A utility bag system, comprising:
a body portion having a plurality of walls;
a lid portion attached to the body portion;
a utility extension that is configured to selectively attach to the body portion and the lid portion, the utility extension being arranged to removably attach to each of the body portion and the lid portion such that when the utility extension is attached to one of the body portion and the lid portion, a first magnetozone is on an exterior surface of the utility extension;
a workstation having a second magnetozone; and
a solar panel positioned and located on one of the lid portion and the body portion;
wherein the workstation is formed on a top surface of the lid portion such that metallic or magnetized articles placed on the top surface of the lid portion remain secured to the top surface of the lid portion,
wherein the lid portion or at least one of the plurality of walls is flexible.

13. The utility bag system in claim 12, wherein the body portion is formed as a soft-body with the plurality of walls made of a flexible material.

14. The utility bag system in claim 12, wherein the body portion has a rigid bottom and the body portion is collapsible.

* * * * *